(12) United States Patent
Sakamoto (10) Patent No.: US 7,463,331 B2
(45) Date of Patent: Dec. 9, 2008

(54) EXPOSURE APPARATUS AND METHOD FOR MANUFACTURING DEVICE

(75) Inventor: Eiji Sakamoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/859,541

(22) Filed: Sep. 21, 2007

(65) Prior Publication Data

US 2008/0129971 A1    Jun. 5, 2008

(30) Foreign Application Priority Data

Dec. 1, 2006    (JP)    ............................. 2006-325669

(51) Int. Cl.
*G03B 27/52*    (2006.01)
*G03B 27/42*    (2006.01)

(52) U.S. Cl. .......................................... 355/30; 355/53
(58) Field of Classification Search ................... 355/30, 355/53, 55, 67; 359/507, 509, 819, 820
See application file for complete search history.

(56) References Cited

U.S. PATENT DOCUMENTS

| 5,907,390 | A | 5/1999 | Sakamoto |
| 6,496,246 | B1 * | 12/2002 | Spinali ........................ 355/67 |
| 6,853,439 | B1 | 2/2005 | Hase |
| 6,970,228 | B1 * | 11/2005 | Aoki et al. .................... 355/30 |

FOREIGN PATENT DOCUMENTS

| JP | 11-145053 A | 5/1999 |
| JP | 2005-183624 A | 7/2005 |

* cited by examiner

*Primary Examiner*—Hung Henry Nguyen
(74) *Attorney, Agent, or Firm*—Canon U.S.A., Inc. I.P. Division (57) ABSTRACT

An exposure apparatus used to expose a substrate includes an optical system which includes two optical elements and which is configured to guide light emitted from a light source to the substrate, gas supply sections configured to supply gas to a space between the optical elements, and gas exhaust sections configured to exhaust the gas from the space. The gas is supplied to the space such that a swirl flow is formed in the space.

8 Claims, 13 Drawing Sheets

EXPOSURE APPARATUS AND METHOD FOR MANUFACTURING DEVICE

BACKGROUND OF THE INVENTION

1. Field of the Invention

The present invention relates to an exposure apparatus and a method for manufacturing a device.

2. Description of the Related Art

Conventional exposure apparatuses for manufacturing semiconductor integrated circuits use light of various wavelengths for exposure. The followings are used for exposure: an i-line with a wavelength of 365 nm, a KrF excimer laser beam with a wavelength of 248 nm, an ArF excimer laser beam with a wavelength of 193 nm, and X-rays. Light emitted from a light source passes through a projection optical system, including projection lenses, for projecting a pattern formed on an original onto a substrate. This forms the pattern on the substrate. The conventional exposure apparatuses need to have high throughput and high resolution because of the reduction in the width of pattern lines. Therefore, high-energy exposure sources are being demanded and light with a shorter wavelength is also being demanded for exposure.

Exposure light with a short wavelength is known to cause the photochemical reaction between oxygen and impurities present in the exposure apparatuses. The products of the photochemical reaction, that is, chemical contaminants adhere to optical elements, such as lenses and mirrors, included in optical systems disposed in the exposure apparatuses. This causes a problem that fog is caused in the exposure light. Examples of the impurities include basic gases derived from resists and organic silicon compounds, such as siloxanes, derived from adhesives used for the optical elements. The impurities cover gaseous substances and solid substances, for example, suspended particulate matter.

An exposure apparatus is usually placed in a chamber. The chamber includes a gas temperature control unit, an ultra-low penetration air (ULPA) filter, and a chemical filter. Gas supplied to the chamber is maintained at a constant temperature and has an extremely low impurity content.

There are many impurity sources in the exposure apparatus. For example, an adhesive is used to fix optical elements to supporting members disposed in a lens barrel. The adhesive is usually an elastic adhesive, which usually contains a siloxane. The siloxane can cause fog in these optical elements. Therefore, the concentration of impurities in the lens barrel needs to be low.

Figure 20:
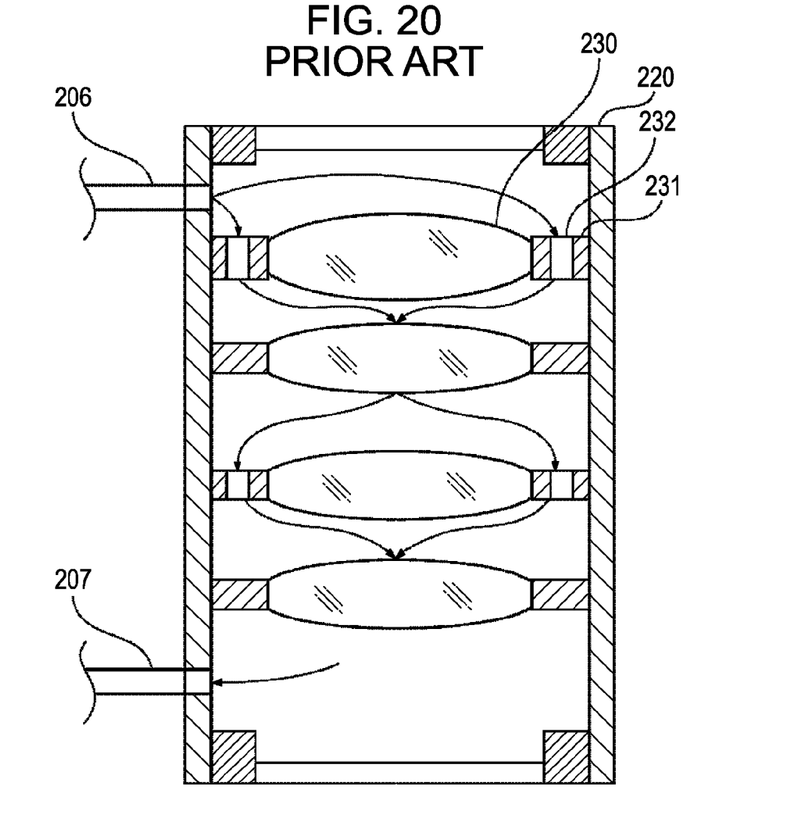
FIG. 20 is a sectional view of a lens barrel disclosed in Japanese Patent Laid-Open No. 11-145053.

In order to solve the problem, Japanese Patent Laid-Open No. 11-145053 proposes a lens barrel 220 shown in FIG. 20. The lens barrel 220 includes lenses 230 and supporting members 231, having openings 232, for supporting the lenses 230. This configuration allows gas to flow through spaces partitioned by the lenses 230 and the supporting members 231. The lens barrel 220 is connected to a supply unit 206 and a recovery unit 207; hence, the atmosphere in the lens barrel 220 can be replaced with a purge gas.

Figure 21:
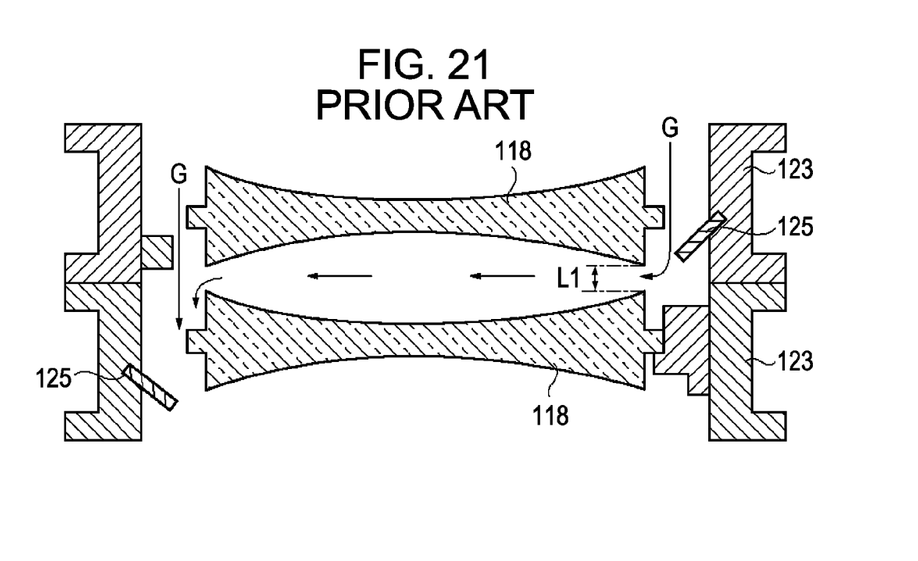
FIG. 21 is an illustration showing conventional lens barrels.

Japanese Patent Laid-Open No. 2005-183624 proposes lens barrels 123 shown in FIG. 21. The lens barrels 123 include gas guides 125 for guiding a purge gas G to lenses 118 having a gap L1 therebetween. This configuration is effective in efficiently removing impurities from the lens barrels 123.

In the lens barrel 220 disclosed in Japanese Patent Laid-Open No. 11-145053, although the openings 232 are arranged around each lens 230 as shown in FIG. 20, the purge gas hardly flows on the lens 230. Therefore, if impurities causing fog are produced in the lens barrel 220, the concentration of the impurities present on the lens 230 is high because of diffusion and cannot be sufficiently reduced. In the lens barrels 123 disclosed in Japanese Patent Laid-Open No. 2005-183624, the purge gas G flows on the lenses 118 as shown in FIG. 21. An increase in the amount of the purge gas G flowing on each lens 118 causes an increase in the amount of chemical contaminants. Therefore, the lens barrels 123 disclosed in Japanese Patent Laid-Open No. 2005-183624 are ineffective in preventing the fog of the lens 118.

Lenses usually have an axisymmetric spherical surface or axisymmetric aspherical surface. Therefore, although the temperature distribution in the lenses or the distortion thereof may deteriorate optical properties of optical systems, the optical aberration caused by the temperature distribution or the distortion can be readily corrected when the temperature distribution or the distortion is axisymmetric. However, in the lens barrels 123 disclosed in Japanese Patent Laid-Open No. 2005-183624, if the purge gas G flows on each lens 118 in one direction, the temperature distribution in the lens 118 is not axisymmetric; hence, it is difficult to correct the optical aberration caused by the temperature distribution.

SUMMARY OF THE INVENTION

The present invention provides an exposure apparatus in which properties of optical elements can be prevented from being deteriorated.

An aspect of the present invention provides an exposure apparatus used to expose a substrate. This exposure apparatus includes an optical system which includes two optical elements and which is configured to guide light emitted from a light source to the substrate, gas supply sections configured to supply gas to a space between the optical elements, and gas exhaust sections configured to exhaust the gas from the space. The gas is supplied to the space such that a swirl flow is formed in the space.

Further features and aspects of the present invention will become apparent from the following description of exemplary embodiments with reference to the attached drawings.

DESCRIPTION OF THE EMBODIMENTS

Figure 1:
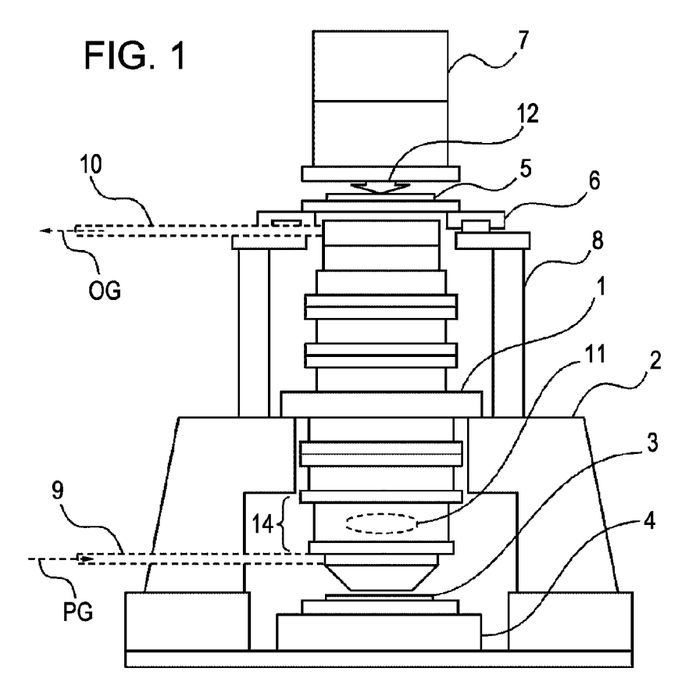
FIG. 1 is a schematic view of an example exposure apparatus according to an embodiment of the present invention.

Various embodiments of the present invention will now be described with reference to the attached drawings. FIG. 1 schematically shows an exposure apparatus according to an embodiment of the present invention.

The exposure apparatus is usually placed in a chamber, which is not shown. The chamber includes a gas temperature control unit, a ULPA filter, and a chemical filter. The atmosphere in the chamber is maintained at a constant temperature and has an extremely low impurity content.

With reference to FIG. 1, the exposure apparatus includes an illumination optical system 7, an original stage 6 for supporting an original 5, a lens barrel 1 for projection, a substrate stage 4 for supporting a substrate 3, a body base 2, and a support frame 8. The substrate stage 4, the lens barrel 1, and the support frame 8 are disposed on the body base 2. The original stage 6 is disposed on the support frame 8.

The illumination optical system 7 illuminates the original 5 with light 12 emitted from a light source. The lens barrel 1 includes a projection optical system and projects a pattern onto the substrate 3 through the original 5. The substrate 3 is a wafer or a glass plate and is coated with a photosensitizing agent.

The original 5 is a reticle or a mask and has a circuit pattern for exposing the substrate 3.

There are pipes which are provided which extend through the wall of the lens barrel 1, which include gas supply pipes 9, serving as gas supply sections, for introducing gas into the lens barrel 1 and gas exhaust pipes 10, serving as gas exhaust sections, for discharging gas from the lens barrel 1.

A gas PG is introduced into the lens barrel 1 through the gas supply pipes 9 and then exhausted from the lens barrel 1 through the gas exhaust pipes 10, whereby the atmosphere in the lens barrel 1 is replaced the gas PG.

A gas supply unit is located upstream of the gas supply pipes 9 and controls the temperature and humidity of the gas PG and the content of impurities in the gas PG. Examples of the gas PG include rare gases such as helium, neon, argon, and krypton and inert gases such as nitrogen.

If an expensive gas is used, a gas purification unit for purifying an outlet gas OG exhausted from the lens barrel 1 may be provided downstream of the gas exhaust pipes 10 such that the outlet gas OG is recycled.

Figure 2:
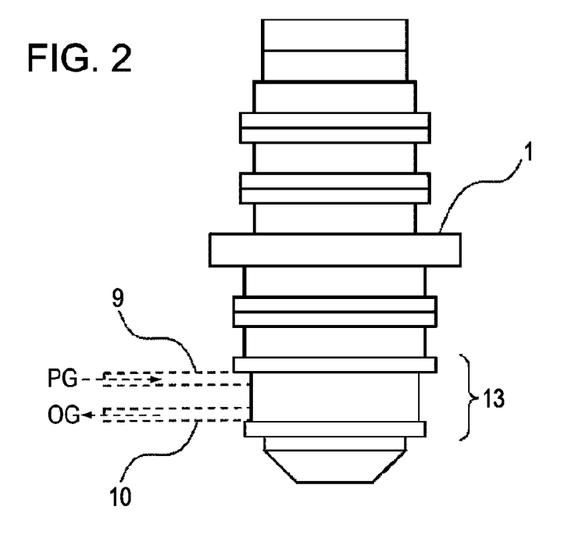
FIG. 2 is a schematic view of an example lens barrel.

The gas PG may be supplied to a portion of the lens barrel 1 so as to fill the lens barrel 1 and then exhausted from another portion of the lens barrel 1 as shown in FIG. 1 or may be supplied to a specific portion of a lens barrel unit 13 as shown in FIG. 2.

First Exemplary Embodiment

Figure 3:
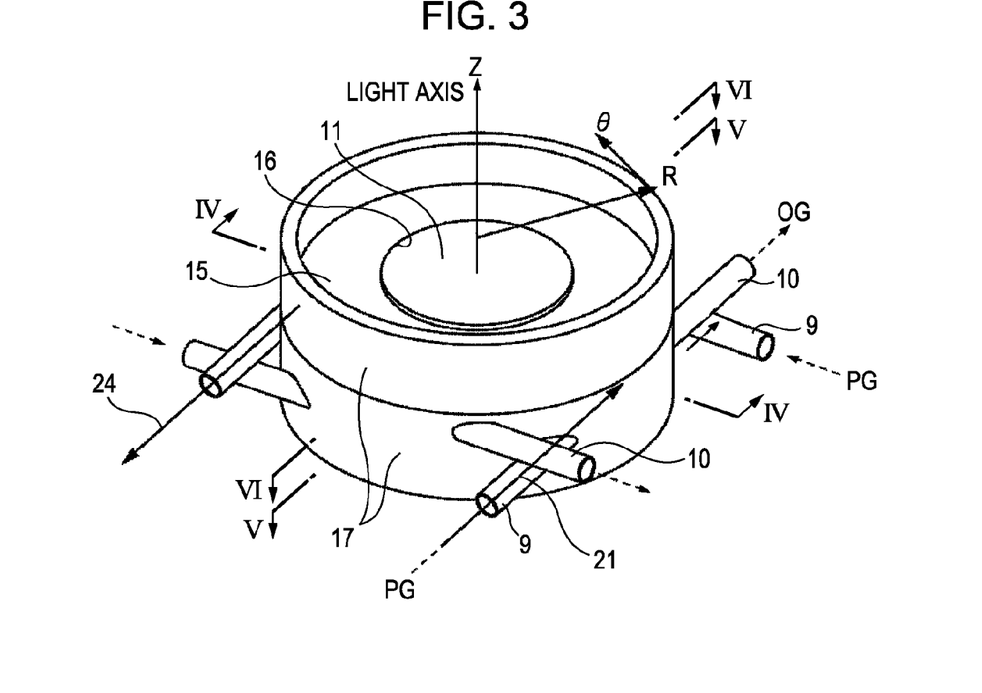
FIG. 3 is an enlarged view of a lens barrel unit included in the exposure apparatus shown in FIG. 1.

FIG. 3 is an enlarged view of the lens barrel unit 13. The lens barrel unit 13 is included in the lens barrel 1. In this example, the light axis of the projection optical system is defined as the Z coordinate of a cylindrical coordinate system, the radial direction of optical elements 11 disposed in the lens barrel unit 13 is defined as an R direction, and the circumferential direction of the optical elements 11 is defined as a θ direction as shown in FIG. 3. The optical elements 11 are each fixed in a support member 15 with an adhesive 16. The support members 15 are each fitted in a lens tube 17.

Examples of the optical elements 11 include lenses, mirrors, and diffractive optical elements.

Because of temperature change, the optical elements 11 and the support members 15 can be distorted (e.g., expanded or contracted). Therefore, if each optical element 11 and support member 15 are rigidly fixed together, optical properties of the optical element 11 are deteriorated because the stress caused by the distortion of the optical element 11 and the support member 15 is applied to the optical element 11. In order to reduce the stress applied to the optical element 11, the adhesive 16 is preferably an elastic adhesive.

Such an elastic adhesive contains a low-molecular weight organic compound such as a solvent, a modified silicone resin serving as a principal component, and an epoxy resin and therefore emits out gases, or impurities. The out gases have been the cause of chemical contamination.

Figure 4:
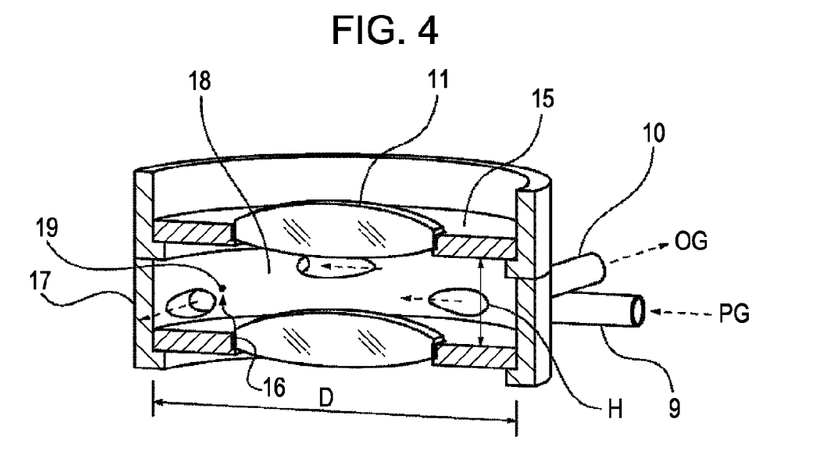
FIG. 4 is a sectional view of the lens barrel unit 13 taken along the line VI-VI of FIG. 3.

FIG. 4 is a sectional view of the lens barrel unit 13 taken along the line IV-IV of FIG. 3. The lens barrel unit 13 has closed spaces 18 surrounded by the optical elements 11, the support members 15, and the lens tubes 17. The size of the closed spaces 18 is substantially defined by the inside diameter D of the lens tubes 17 and the distance H between two of the support members 15 arranged in the Z direction. The height of a center portion of each closed space 18 may be less or greater than the distance H between two of the support members 15 depending on the surface curvature of the optical elements 11. Since the adhesive 16 emits the impurities in the closed spaces 18 even if a sufficient amount of time has elapsed, molecules 19 of the impurities are present in the closed spaces 18.

Figure 5:
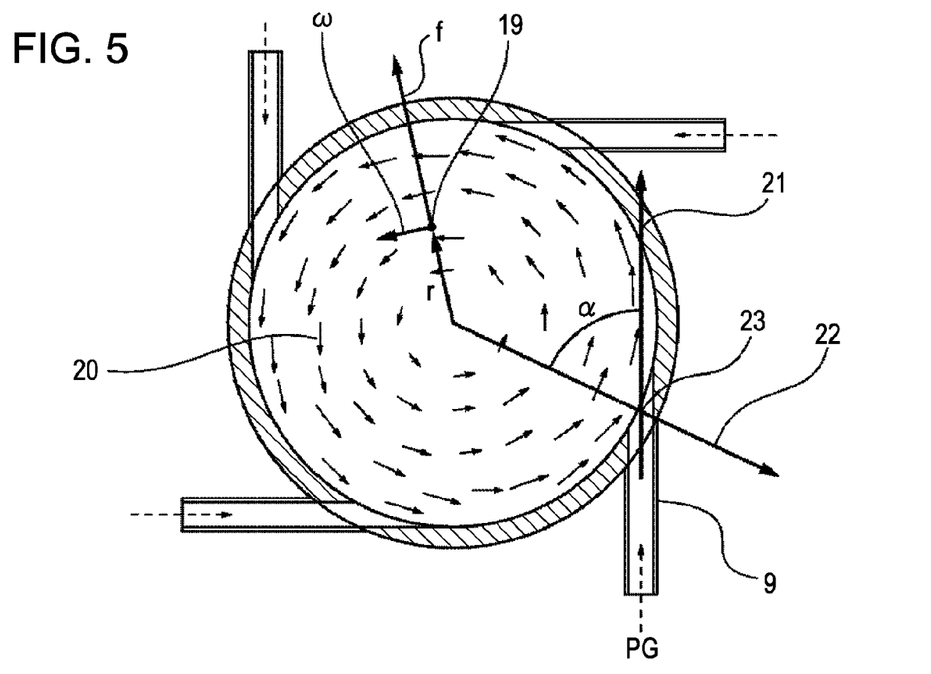
FIG. 5 is a horizontal sectional view of the lens barrel unit taken along a plane including gas supply pipes shown in FIG. 3.

FIG. 5 is a horizontal sectional view of the lens barrel unit 13 taken along a plane including the gas supply pipes 9 shown in FIG. 3. With reference to FIG. 5, reference numeral 23 denotes the intersection of the central axis 21 of each gas supply pipe 9 and the inner wall of each lens tube 17. An axis 22 extends from the Z coordinate to the intersection 23 in the radial direction of the lens tube 17. The central axis 21 and the axis 22 form an angle α. The gas PG supplied to each closed space 18 through the gas supply pipe 9 forms a swirl flow 20 centered at the Z coordinate. The swirl flow 20 has a flow velocity vector with a circumferential vector component. The impurity molecules 19 move around the Z coordinate at an angular velocity ω together with the swirl flow 20. The impurity molecules 19 spaced from the Z coordinate at a distance r receive a force f.

Figure 6:
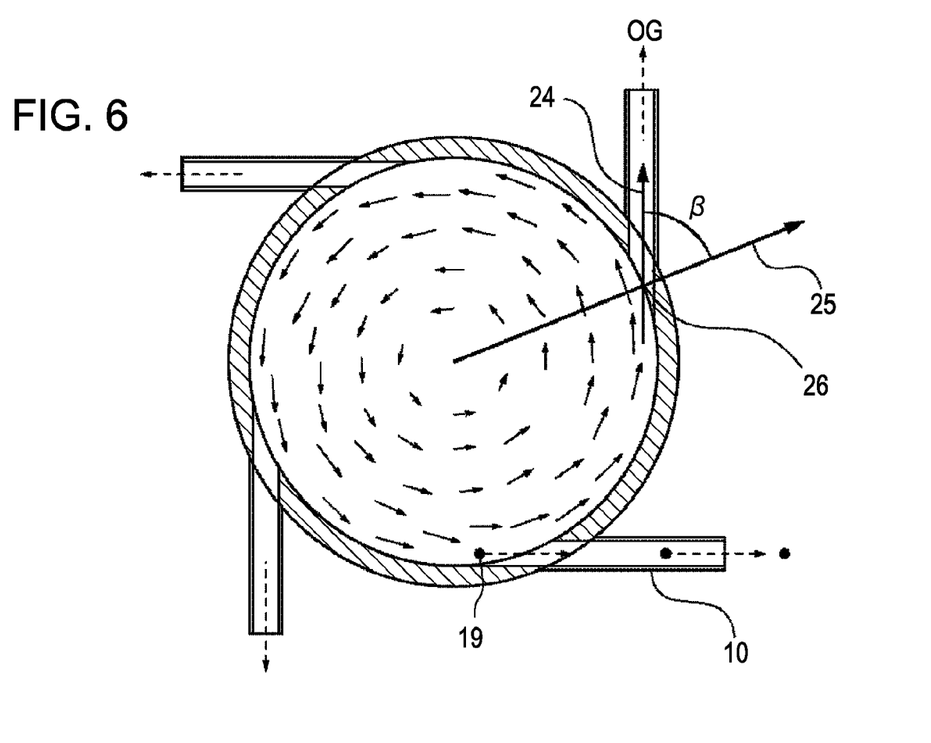
FIG. 6 is a horizontal sectional view of the lens barrel unit taken along a plane including gas exhaust pipes shown in FIG. 3.

FIG. 6 is a horizontal sectional view of the lens barrel unit 13 taken along a plane including the gas exhaust pipes 10 shown in FIG. 3. With reference to FIG. 6, reference numeral 26 denotes the intersection of the central axis 24 of each gas exhaust pipe 10 and the inner wall of each lens tube 17. An axis 25 extends from the Z coordinate to the intersection 26 in the radial direction of the lens tube 17. The central axis 24 and the axis 25 form an angle β.

When the angle α shown in FIG. 5 is greater than 0 degree and less than 90 degrees, the gas PG supplied to the closed space 18 has a circumferential vector component and forms the swirl flow 20. In order to allow the gas PG to efficiently form the swirl flow 20 at a small flow rate, the angle α is preferably close to 90 degrees and more preferably greater than 45 degree and less than 90 degrees.

In order to form the swirl flow 20 in the circumferential direction of the lens tube 17 such that the swirl flow 20 has substantially a constant angler velocity, the gas supply pipes 9 and the gas exhaust pipes 10 are preferably arranged rotationally symmetrically with respect to the Z coordinate.

Since the swirl flow 20 is formed in the closed space 18, rotationally symmetric circumferential flows centered at the Z coordinate are formed on the optical elements 11 and the support members 15.

This allows the temperature distribution of the gas PG in the closed space 18 to be rotationally symmetric with respect to the light axis of each optical element 11; hence, the temperature distribution of the optical element 11 is not rotationally asymmetric with respect to the light axis thereof and therefore asymmetric aberration can be prevented from being caused.

While the impurity molecules 19 spaced from the Z coordinate at a distance r are moving around the Z coordinate at an angular velocity ω together with the swirl flow 20, the impurity molecules 19 receive the force f as shown in FIG. 5. The force f is represented by the following formula:

$$(\sigma-\rho) \times r\omega^2 \qquad (1)$$

wherein σ is the density of the impurities, ρ is the density of the gas PG, r is the distance between the Z coordinate and the impurity molecules 19, and ω is the angular velocity of the impurity molecules 19. The term $r\omega^2$ represents the centrifugal acceleration.

When $(\sigma-\rho)>0$, the impurity molecules 19 receive a positive force in the radial direction of the lens tube 17. Therefore, the impurity molecules 19 move in the radial direction thereof. This increases the concentration of the impurities in a peripheral portion of the closed space 18 and therefore reduces the concentration of the impurities present on the optical element 11.

Since the concentration of the impurities in the peripheral portion of the closed space 18 is high, the impurities can be efficiently exhausted through the gas exhaust pipes 10 as shown in FIG. 6.

Substances causing the above fog are known to be gaseous siloxanes containing silicon, trimethylsilyl (TMS), and hexamethyldisilazane (HMDS) from the results of analysis. The impurities have a density of greater than 3 kg/m³ at normal temperature and pressure. Therefore, the gas PG, which is supplied to the closed space 18, is preferably helium, neon, argon, or nitrogen because helium has a density of 0.16 kg/m³, neon has a density of 0.82 kg/m³, argon has a density of 1.6 kg/m³, and nitrogen has a density of 1.1 kg/m³ at normal temperature and pressure.

Formula (1) shows that in order to efficiently reduce the concentration of the impurities present on the optical element 11, the density ρ of the gas PG is preferably less than the density σ of the impurities and the angular velocity ω of the impurity molecules 19 is preferably large.

In this embodiment, the closed space 18 has an inner diameter D of about 240 mm, the distance H between the optical elements 11 is about 20 mm, the gas PG is nitrogen, the angles α and β are about 70 degrees, the gas supply pipes 9 and the gas exhaust pipes 10 have an inner cross-sectional area of about 100 mm², the number of the gas supply pipes 9 is four, and the number of the gas exhaust pipes 10 is four.

When the gas PG is supplied to the closed space 18 through the gas supply pipes 9 at a velocity of about 5 m/s, the gas PG flows in the peripheral portion of the closed spaces 18 at a velocity of about 3.5 m/s in the circumferential direction of the closed space 18. The flow rate of the gas PG is about 841 L/min.

In this situation, the angular velocity ω of the impurity molecules 19 is about 35 rad/s. If the impurity molecules 19 are shifted in the radial direction of the closed space 18, the angular velocity ω thereof is hardly varied. The impurity molecules 19 present on the Z coordinate receive no centrifugal acceleration but the impurity molecules 19 apart from the Z coordinate receive a centrifugal acceleration. In usual, molecules of gas and suspended particulate matter are in thermal motion and therefore do not stay at fixed positions. The adhesive 16, which is the source of the impurities as described above, is spaced from the Z coordinate; hence, the impurities emitted in the closed space 18 immediately receive a centrifugal force. This reduces the concentration of the impurities on the optical elements 11.

Modifications of the support members 15 will now be described. The presence of the swirl flow 20 in the closed space 18 can create a pressure difference in the closed space 18 depending on the viscosity coefficient of the gas PG and/or the configuration of the gas exhaust pipes 10 such that the pressure in a peripheral portion is higher than that in a center portion of the closed space 18. Since the velocity of the swirl flow 20 located very close to each support member 15 is close to zero, the impurities move on a surface of the support member 15 in the –R direction because of the pressure difference. This is referred to as secondary flow.

Figure 7A:
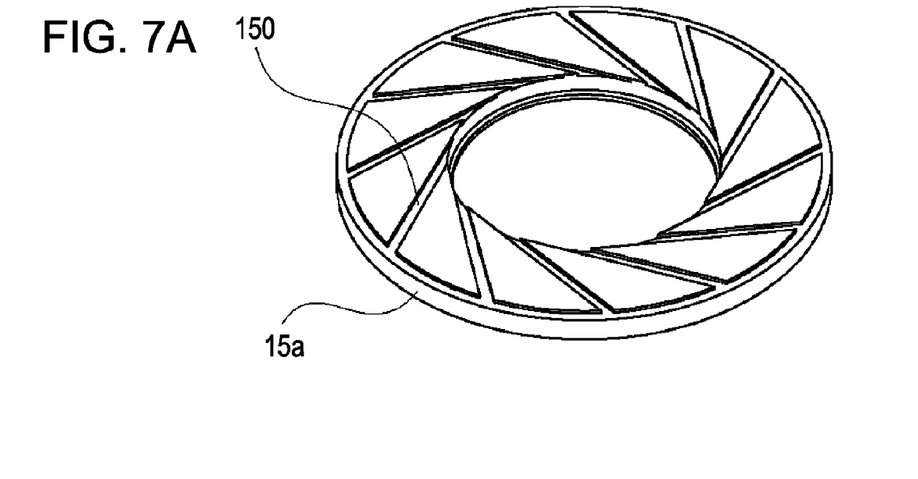
FIG. 7A is an illustration of a support member having grooves with a rectangular shape in cross section.
Figure 7B:
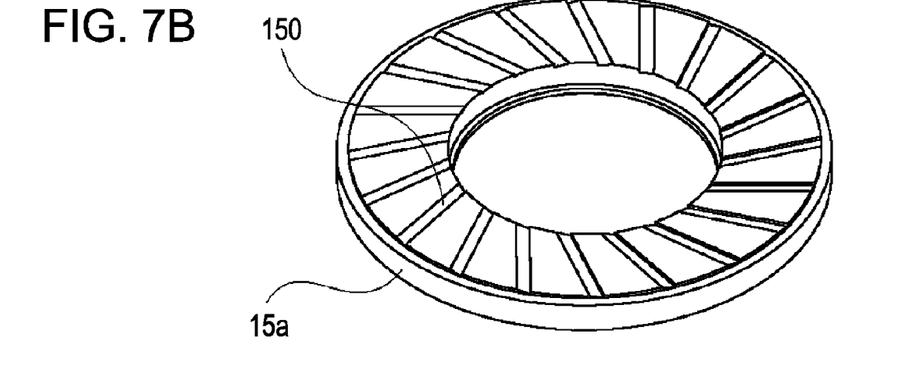
FIG. 7B is an illustration of a support member having grooves with a tapered shape in cross section.
Figure 7C:
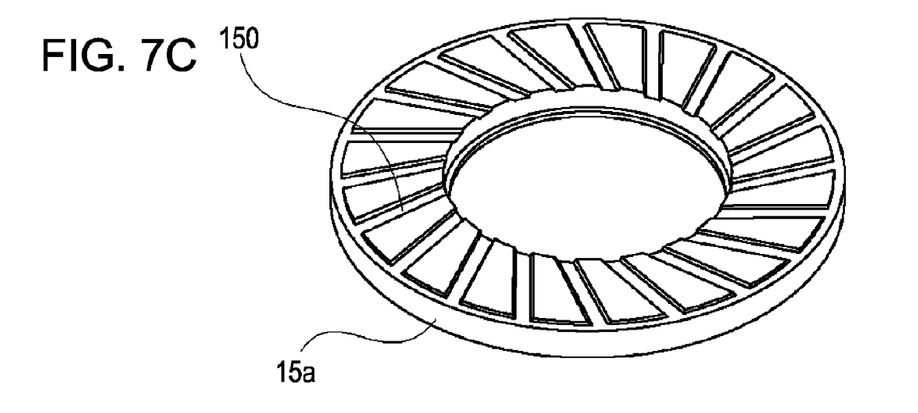
FIG. 7C is an illustration of a support member having grooves with a trapezoidal shape in cross section.

In order to cope with the secondary flow, support members 15a shown in FIG. 7A may be used instead of the support members 15. The support members 15a have support portions for supporting the optical elements 11 and also have grooves 150 extending outward from the support portions. The grooves 150 may have a rectangular shape, a tapered shape, or a trapezoidal shape in cross section as shown in FIG. 7A, 7B, or 7C, respectively, when viewed in the longitudinal direction thereof. Alternatively, the grooves 150 may have another shape in cross section.

Figure 8:
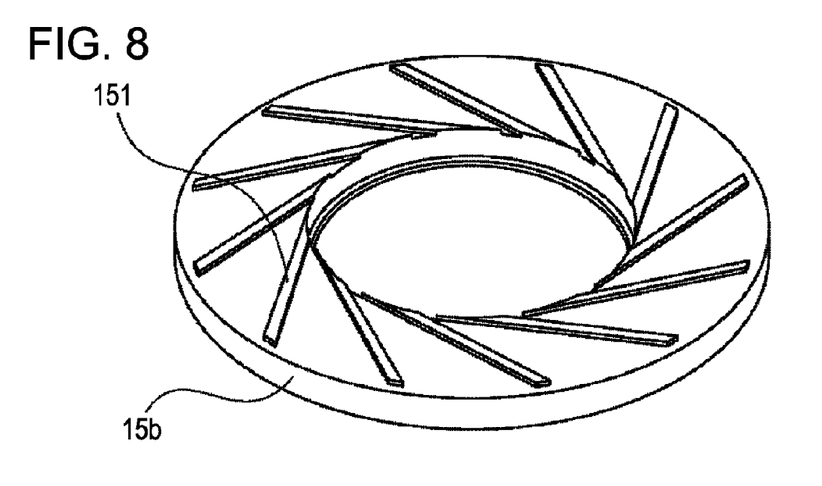
FIG. 8 is an illustration of a support member having ridges.

Alternatively, support members 15b shown in FIG. 8 may be used instead of the support members 15. The support members 15b have support portions for supporting the optical elements 11 and ridges 151 extending outward from the support portions. The ridges 151 as well as the grooves 150 may have a rectangular shape, a tapered shape, a trapezoidal shape, or another shape in cross section.

Figure 9:
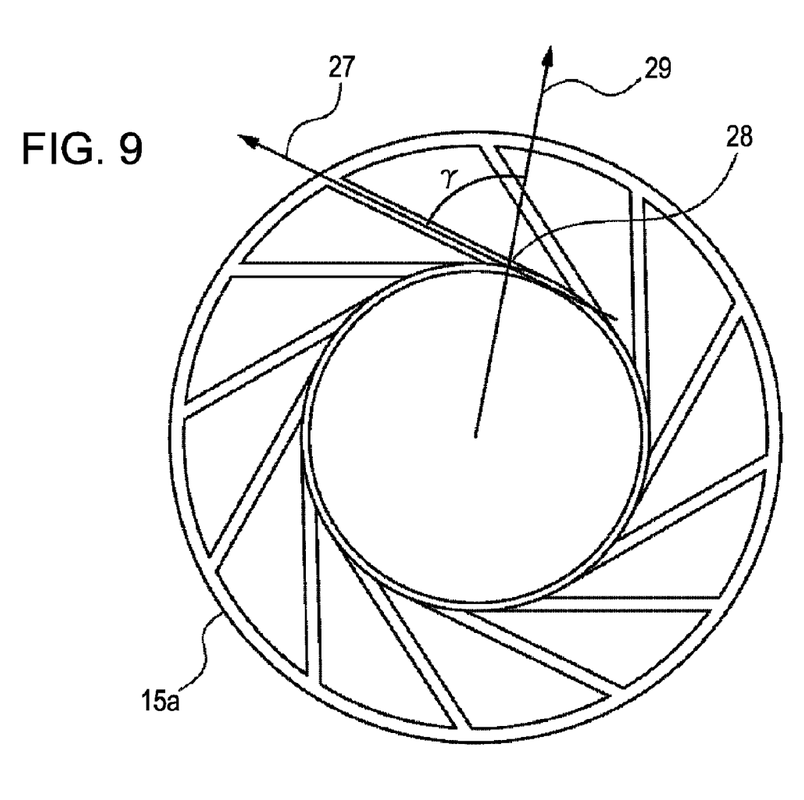
FIG. 9 is a top view of the support member shown in FIG. 7A.

FIG. 9 is a top view of one of the support members 15a. The grooves 150 each have an axis 27. Reference numeral 28 denotes the intersection of the axis 27 and the inner edge of each support member 15a. An axis 29 extends from the Z coordinate toward the intersection 28. The axes 27 and 29 form an angle γ.

The swirl flow 20 is applied to one of the walls of the grooves 150, whereby a sub-flow parallel to the axis 27 is formed near a surface of the support member 15a. When the angle γ is greater than 0 degree and less than 90 degrees, the sub-flow parallel to the axis 27 has a vector component directed in the +R direction. This prevents the secondary flow to move the impurities outward. This advantage can be achieved using the support members 15b.

Figure 10:
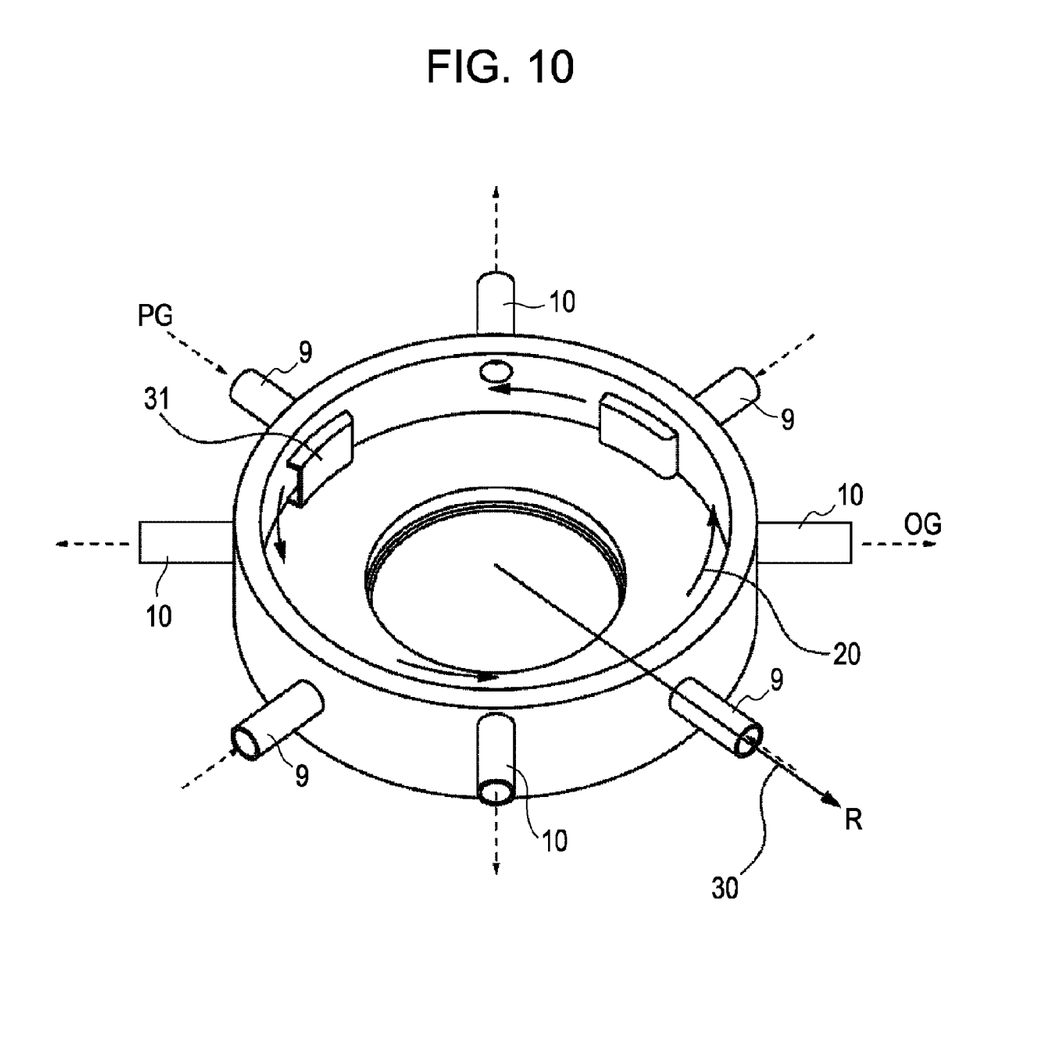
FIG. 10 is an illustration showing nozzles.

Modifications of the gas supply sections will now be described. The swirl flow 20 is formed in such a manner that the gas supply pipes 9 are communicatively connected to each lens tube 17 such that the angle α is greater than zero degree and less than 90 degrees. It may be difficult to communicatively connect the gas supply pipes 9 to the lens tube 17 such that the angle α is within the above range, depending on a material for forming the lens tube 17. In this case, the gas supply pipes 9 may be communicatively connected to the lens tube 17 such that the central axes 30 of the gas supply pipes 9 extend in the radial direction of the lens tube 17. Furthermore, nozzles 31 may be provided in the lens tube 17 such that openings of the nozzles 31 are connected to the gas supply pipes 9 as shown in FIG. 10. According to this configuration, through-holes can be formed in the wall of the lens tube 17 perpendicularly to the wall thereof. Therefore, the gas supply pipes 9 can be readily connected to the lens tube 17. The gas PG is supplied to the closed space 18 through the nozzles 31 so as to have a circumferential vector component, whereby the swirl flow 20 is formed. In this configuration, if no nozzles are connected to the gas exhaust pipes 10, the swirl flow 20 can be formed.

Second Exemplary Embodiment

Figure 11:
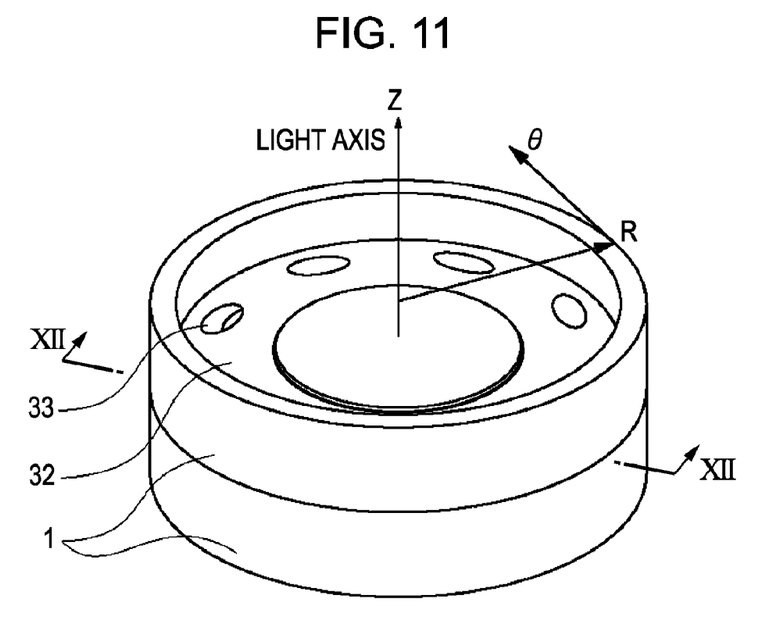
FIG. 11 is an enlarged view of a lens barrel unit 14 shown in FIG. 1.

FIG. 11 is a partially enlarged view of a lens barrel unit 14 shown in FIG. 1. A cylindrical coordinate system is defined in the same manner as that described above with reference to FIG. 3. The radial direction of optical elements is defined as an R direction, and the circumferential direction of the optical elements is defined as a θ direction.

This embodiment is different from the first embodiment in that support members 32 each have through-holes 33. The through-holes 33 serve as gas supply sections for supplying gas to a closed space located thereon or serve as gas exhaust sections for discharging gas from a closed space located thereunder.

Figure 12:
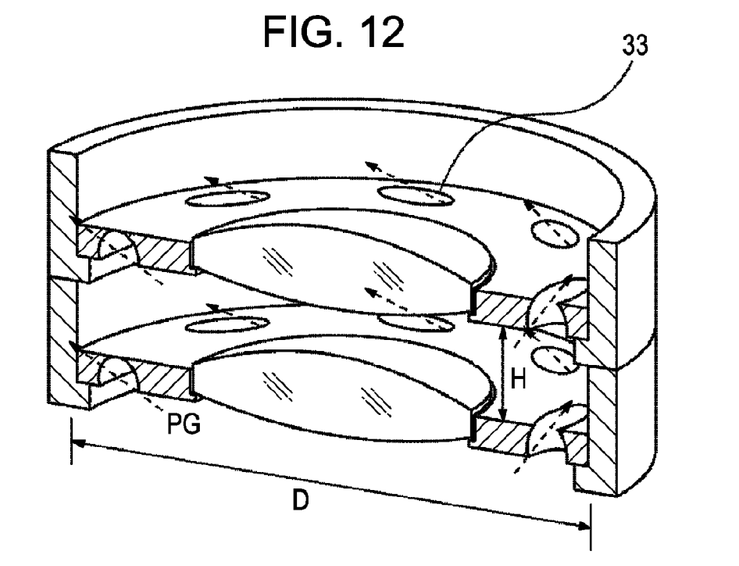
FIG. 12 is a sectional view of the lens barrel unit taken along the line XII-XII of FIG. 11.
Figure 13:
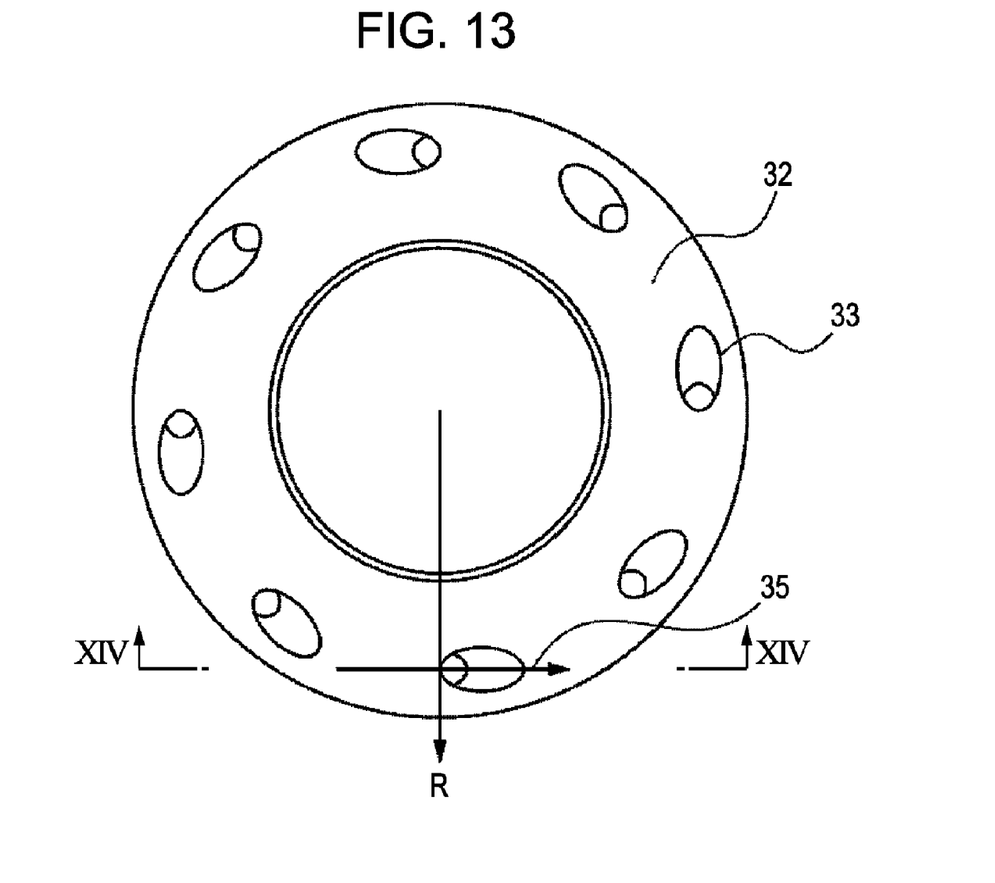
FIG. 13 is a top view of a support member disposed in the lens barrel unit shown in FIG. 12.

FIG. 12 is a sectional view of the lens barrel unit 14 taken along the line XII-XII of FIG. 11. FIG. 13 is a top view of one of the support members 32. Reference numeral 35 represents the central axis of each through-hole 33.

Figure 14:
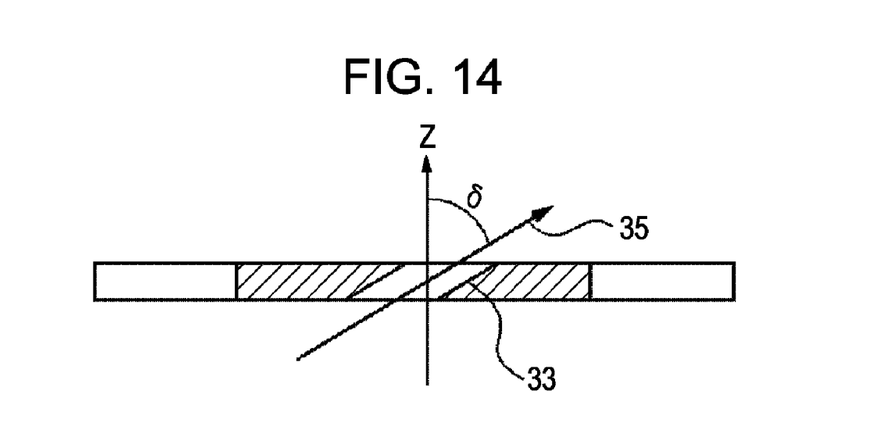
FIG. 14 is a sectional view of the support member taken along the line XIV-XIV of FIG. 13.

FIG. 14 is a sectional view of the support member 32 taken along the line XIV-XIV of FIG. 13. The central axis 35 of the through-hole 33 is tilted against the Z coordinate and the central axis 35 and the Z coordinate form an angle δ. When the angle δ is greater than zero degree and less than 90 degrees, the gas PG supplied to each closed space 18 has a circumferential vector component and therefore a swirl flow can be formed. In order to efficiently form the swirl flow using a small amount of the gas PG, the angle δ is preferably close to 90 degrees and more preferably greater than 45 degrees and less than 90 degrees.

In this embodiment, the closed space 18 has an inner diameter D of about 240 mm, the distance H between the optical elements is about 20 mm, the gas PG is nitrogen, the through-holes 33 have a cross-sectional area of about 71 mm$^2$, the number of the through-holes 33 arranged in each support member 32 is eight, and the gas PG is supplied to the closed space 18 at a velocity of about 5 m/s. This allows the gas PG to flow in a peripheral portion of the closed space 18 at a velocity of about 3.7 m/s in the circumferential direction of the closed space 18. The flow rate of the gas PG is about 130 L/min. The angular velocity ω of molecules of impurities is about 37 rad/s. If the impurity molecules are shifted in the radial direction of the closed space 18, the angular velocity ω thereof is hardly varied.

In this embodiment, the closed spaces 18 are communicatively connected to each other with the through-holes 33 arranged in the support members 32. The gas PG is supplied to one of the closed spaces 18 from the outside of a lens barrel 1 and is then exhausted from the lens barrel 1 through one of the closed spaces 18 that is located most downstream. Therefore, as the gas PG approaches the most downstream closed space 18, the concentration of the impurities in the gas PG becomes high.

Figure 15:
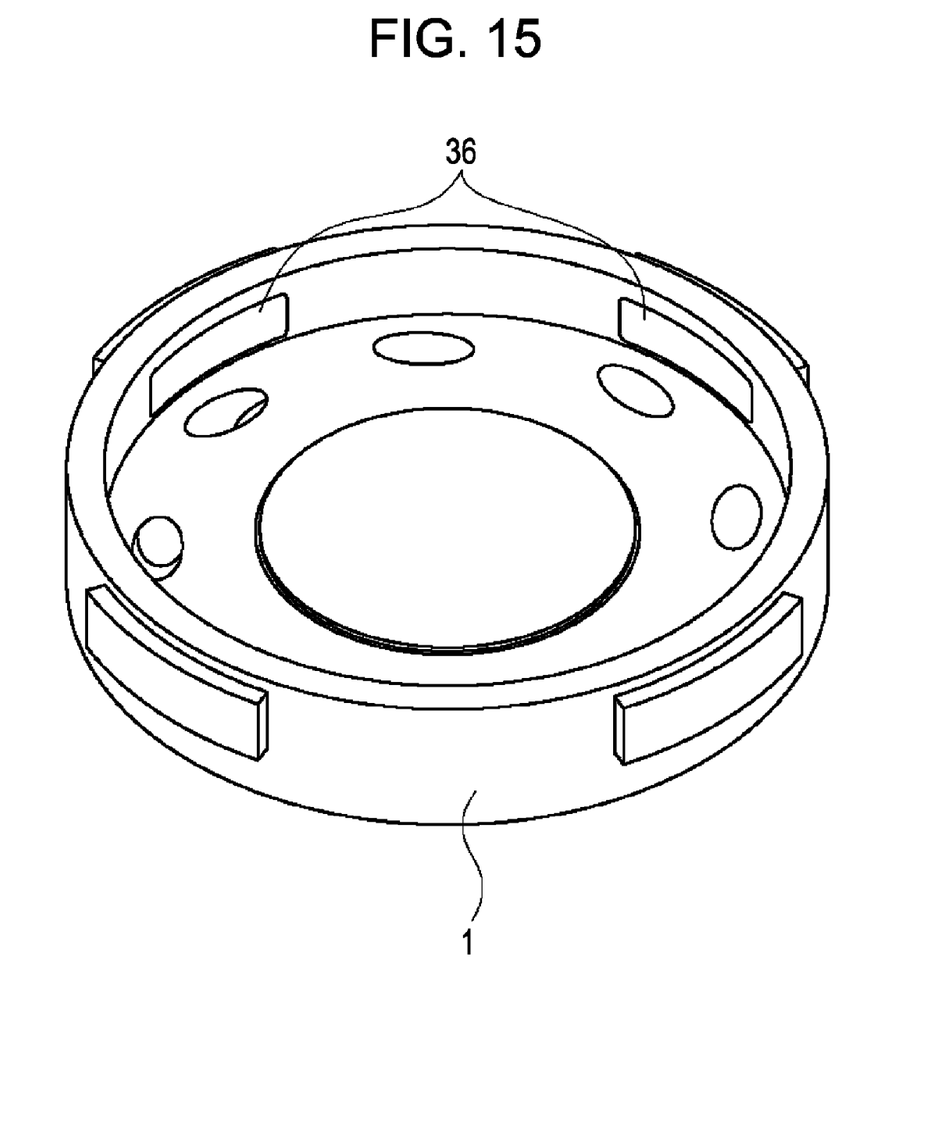
FIG. 15 is an illustration showing impurity-adsorbing members.

The swirl flow is present in each closed space 18 and therefore the concentration of the impurities present on each optical element 11 is maintained low. In order to further reduce the concentration of the impurities on the optical element 11, impurity-adsorbing members 36 may be arranged on the inner surface of the lens barrel 1 as shown in FIG. 15. In particular, the impurity-adsorbing members 36 may be arranged in one or more of the closed spaces 18 that are located downstream. The impurity-adsorbing members 36 may be made of a material, such as active carbon, a porous ceramic material, or a porous metal, capable of adsorbing gaseous siloxanes.

When the impurity-adsorbing members 36 are arranged on portions on which the impurity concentration is high, the impurity concentration can be efficiently reduced. Although the closed spaces 18 are communicatively connected to each other, the concentration of the impurities on the optical elements 11 can be maintained low.

Figure 16:
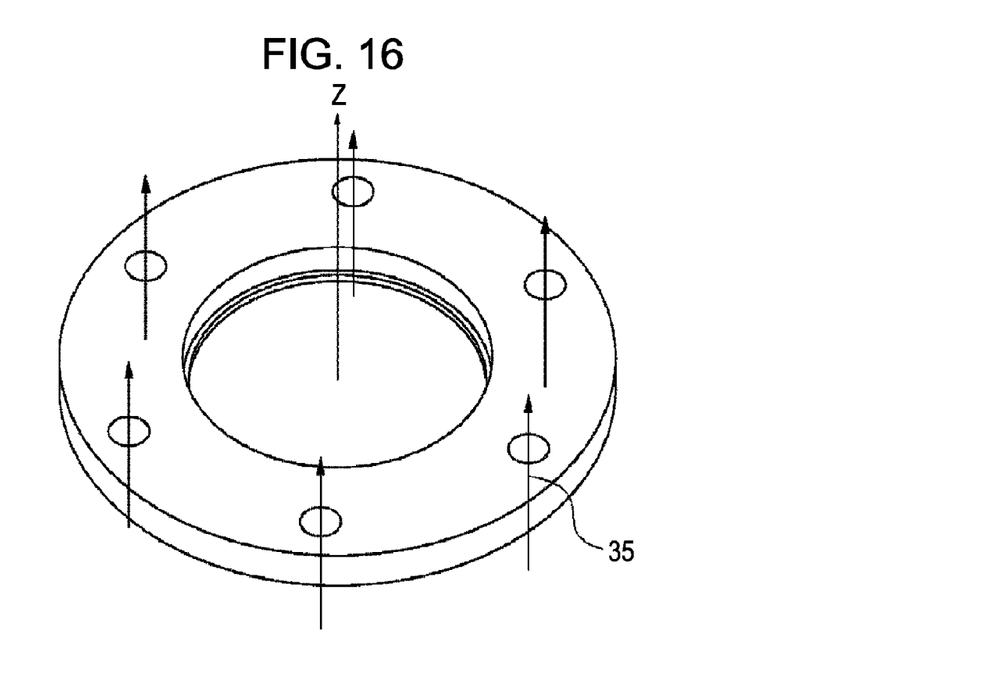
FIG. 16 is a perspective view of a support member.
Figure 17:
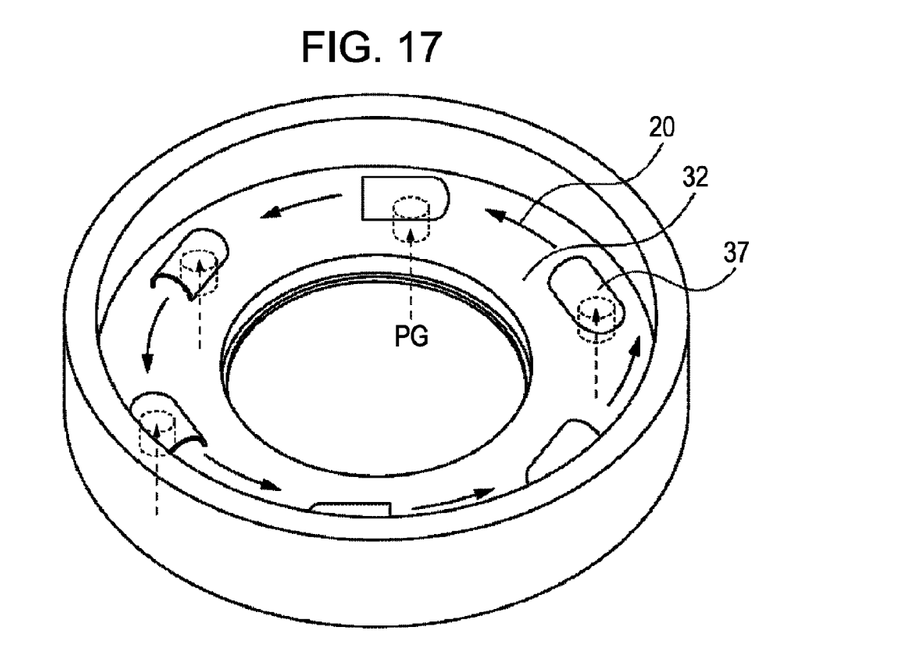
FIG. 17 is an illustration showing nozzles.

In this embodiment, the swirl flow is formed in such a manner that the through-holes 33 are arranged in each support member 32 such that the angle δ is greater than zero degree and less than 90 degrees. It may be difficult to arrange the through-holes 33 in the support member 32 such that the angle δ is as described above, depending on a material for forming the support member 32. In this case, the through-holes 33 are arranged in the support member 32 such that the central axis 35 of each through-hole 33 is parallel to the Z coordinate as shown in FIG. 16. Furthermore, nozzles 37 having openings directed in the circumferential direction of the support member 32 may be connected to the through-holes 33 as shown in FIG. 17. According to this configuration, the through-holes 33 can be readily provided in the support member 32 and the nozzles 37 allow the gas PG, which is supplied to each closed space 18, to have a circumferential vector component. This is effective in forming the swirl flow.

It is noted that the modifications described in the first embodiment can be applied to this embodiment. Also, in the above embodiments, the present invention is applied to the projection optical system; however, it is also noted that the present invention can be also applied to lens barrels including illumination optical systems.

Third Exemplary Embodiment

Figure 18:
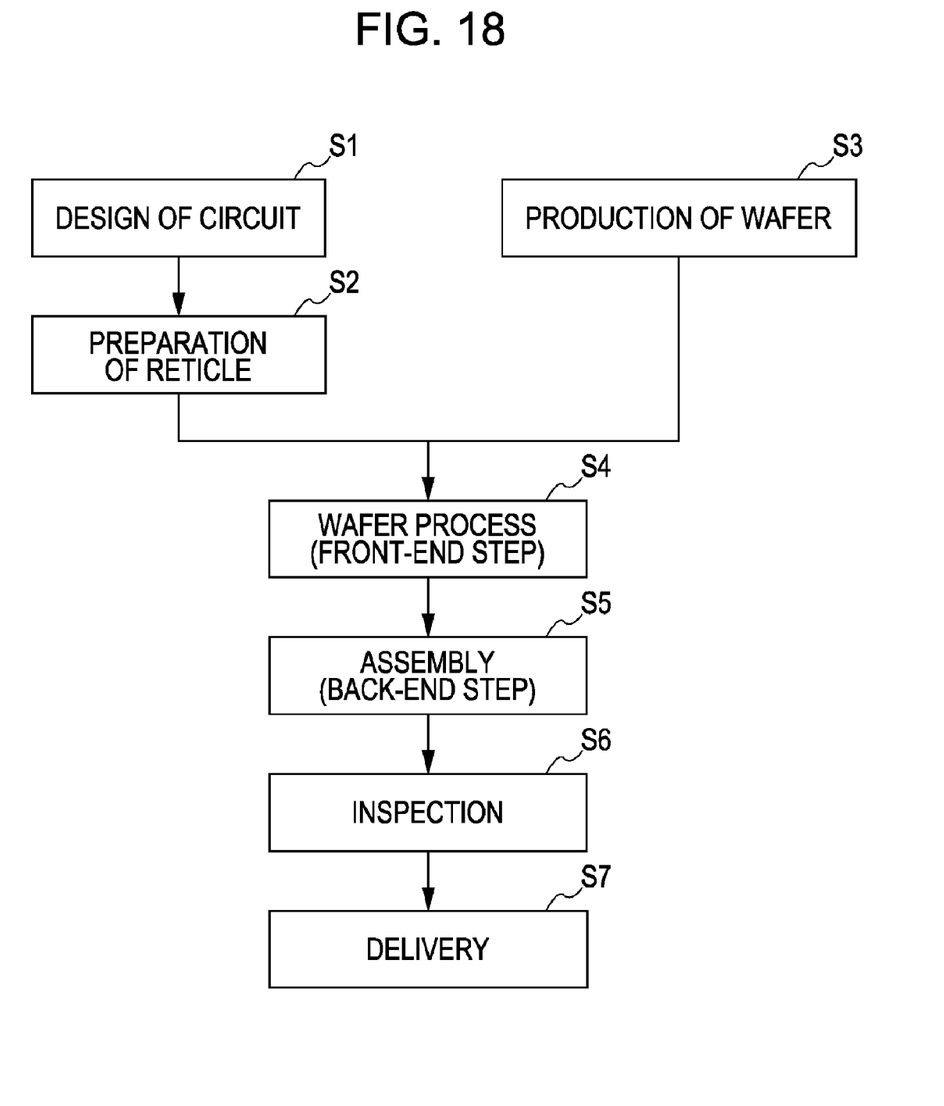
FIG. 18 is a flow chart illustrating an example method for manufacturing a device.

An example method for manufacturing devices such as semiconductor devices or liquid crystal devices will now be described with reference to FIGS. 18 and 19. The method uses the above exposure apparatus. FIG. 18 is a flow chart illustrating the method. In this embodiment, the manufacture of semiconductor devices is described. In Step S1, circuits for the semiconductor devices are designed. In Step S2, a reticle having a pattern for forming the circuits is prepared. In Step S3, a wafer is produced from a semiconductor material such as silicon. In Step S4, which is referred to as a front end step, the circuits are formed on the wafer by lithography using the reticle. In Step S5, which is referred to as a back end step, the wafer treated in Step S4 is processed into semiconductor chips. Step S5 includes an assembly sub-step including a dicing operation and a bonding operation and a packaging sub-step including a chip-sealing operation. In Step S6, the semiconductor devices obtained in Step S5 are inspected operation, durability, and the like. The semiconductor devices are completed through these steps. In Step S7, the semiconductor devices are delivered.

Figure 19:
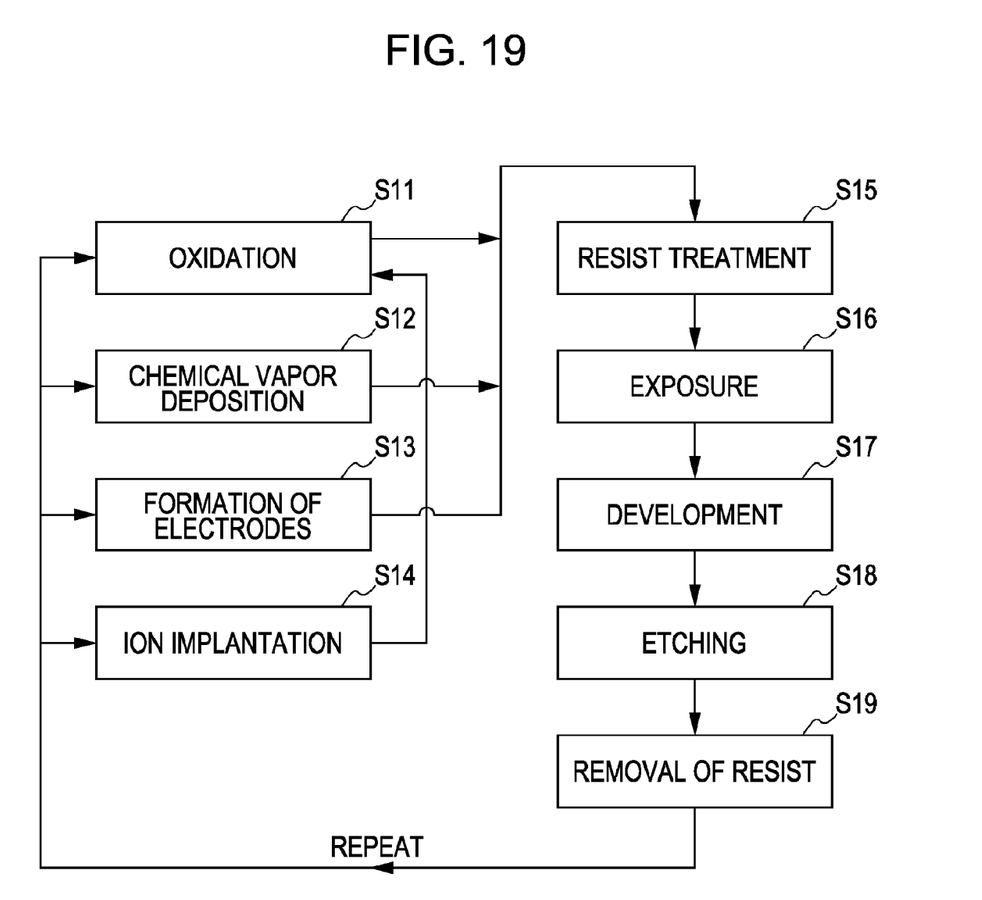
FIG. 19 is a flow chart illustrating Step S4 shown in FIG. 18.

FIG. 19 is a flow chart illustrating Step S4. In Sub-step S11, the wafer is surface-oxidized. In Sub-step S12, an insulating layer is formed on the wafer by chemical vapor deposition (CVD). In Sub-step S13, electrodes are formed on the wafer by vapor deposition or the like. In Sub-step S14, ions are implanted into the wafer. In Sub-step S15, a resist and a photosensitizing agent are applied to the wafer. In Sub-step S16, the wafer is exposed with the exposure apparatus such that the circuit pattern is transferred to the wafer. In Sub-step S17, the exposed wafer is developed. In Sub-step S18, portions other than an image formed by developing the resist are removed by etching. In Sub-step S19, the resist, which has been etched and is not necessary, is removed. Patterns that are the same as the circuit pattern are formed on the wafer by repeating these sub-steps. The method of this embodiment is effective in manufacturing higher-quality devices as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-325669 filed Dec. 1, 2006, which is hereby incorporated by reference herein in its entirety.

What is claimed is:

1. An exposure apparatus configured to expose a substrate, comprising:
   an optical system which includes two optical elements and which is configured to guide light emitted from a light source to the substrate;
   gas supply sections configured to supply gas to a space between the optical elements; and
   gas exhaust sections configured to exhaust the gas from the space,
   wherein the gas is supplied to the space such that a swirl flow is formed in the space,
   wherein the gas supply sections are configured such that the flow velocity vector of the gas supplied to the space has a vector component directed in the circumferential direction of the optical elements, and
   wherein the gas exhaust sections are configured such that the flow velocity vector of the gas exhausted from the space has a vector component directed in the circumferential direction thereof.

2. The exposure apparatus according to claim 1, further comprising a barrel that accommodates the optical elements, wherein the space is surrounded by the barrel and the optical elements and the barrel includes an adsorption member which is placed on the inner surface of the barrel and which adsorbs impurities present in the space.

3. The exposure apparatus according to claim 1, further comprising support members that support the optical elements, wherein the support members have support portions and grooves or ridges extending outward from the support portions and the longitudinal direction of the grooves or ridges is tilted in the direction of the swirl flow with respect to the radial direction of the optical elements.

4. The exposure apparatus according to claim 1, further comprising a barrel that accommodates the optical elements, wherein the space is surrounded by the barrel and the optical elements and the gas supply sections include through-holes arranged in the barrel.

5. The exposure apparatus according to claim 4, wherein the through-holes extend in the circumferential direction of the optical elements, the gas supply sections includes nozzles configured to supply the gas to the space through the through-holes, and the nozzles are configured such that the flow velocity vector of the gas supplied to the space has a vector component directed in the circumferential direction of the optical elements.

6. The exposure apparatus according to claim 1, further comprising support members that support the optical elements, wherein the gas supply sections include through-holes arranged in the support members.

7. The exposure apparatus according to claim 6, wherein the through-holes extend in parallel to the light axis of each optical element, the gas supply sections have nozzles configured to supply the gas to the space through the through-holes, and the nozzles are configured such that the flow velocity vector of the gas supplied to the space has a vector component directed in the circumferential direction of the optical elements.

8. A method for manufacturing a device utilizing an exposure apparatus configured to expose a substrate,
   the exposure apparatus including,
      an optical system which includes two optical elements and which is configured to guide light emitted from a light source to the substrate;
      gas supply sections configured to supply gas to a space between the optical elements; and
      gas exhaust sections configured to exhaust the gas from the space,
      wherein the gas is supplied to the space such that a swirl flow is formed in the space,
      wherein the gas supply sections are configured such that the flow velocity vector of the gas supplied to the space has a vector component directed in the circumferential direction of the optical elements, and
      wherein the gas exhaust sections are configured such that the flow velocity vector of the gas exhausted from the space has a vector component directed in the circumferential direction thereof,
   the method comprising:
      exposing a substrate with the exposure apparatus; and
      developing the exposed substrate.

* * * * *